(12) United States Patent
Saulnier et al.

(10) Patent No.: US 6,710,611 B2
(45) Date of Patent: Mar. 23, 2004

(54) TEST PLATE FOR CERAMIC SURFACE MOUNT DEVICES AND OTHER ELECTRONIC COMPONENTS

(75) Inventors: Christian R. Saulnier, Boutigny (FR); James G. Gasque, Vista, CA (US); Manuel A. Gallardo, Carnetin (FR)

(73) Assignee: Ceramic Component Technologies, Inc., Vista, CA (US)

( * ) Notice: Subject to any disclaimer, the term of this patent is extended or adjusted under 35 U.S.C. 154(b) by 0 days.

(21) Appl. No.: 10/126,004

(22) Filed: Apr. 19, 2002

(65) Prior Publication Data

US 2003/0197500 A1 Oct. 23, 2003

(51) Int. Cl.$^7$ ............................................. G01R 31/02
(52) U.S. Cl. ...................................... 324/755; 324/765
(58) Field of Search ............................ 324/755, 754, 324/758, 765, 158.1; 439/70; 361/756, 799

(56) References Cited

U.S. PATENT DOCUMENTS

| 4,395,184 A | 7/1983 | Braden |
| 4,669,416 A | 6/1987 | Delgado et al. |
| 4,712,062 A | * 12/1987 | Takamine .................... 324/754 |
| 5,144,228 A | * 9/1992 | Sorna et al. ................. 324/754 |
| 5,982,183 A | * 11/1999 | Sano ........................... 324/754 |
| 6,069,480 A | 5/2000 | Sabounchi et al. |
| 6,194,679 B1 | 2/2001 | Garcia et al. |
| 6,204,464 B1 | 3/2001 | Garcia et al. |
| 6,294,747 B1 | 9/2001 | Liu et al. |

* cited by examiner

Primary Examiner—Ernest Karlsen
(74) Attorney, Agent, or Firm—Loyal McKinley Hanson

(57) ABSTRACT

A test plate for holding miniature electronic circuit components as a part of batch processing for parametric testing purposes, including passive, two-terminal, ceramic capacitors, resistors, multilayer inductors, inductor beads, varistors, thermistors, fuses, sensors, actuators, and the like, or another type of device under test (DUT), includes a multilayer DUT-holding plate having a rotational axis and at least two layers centered on the rotational axis. A conductive layer of the two layers includes oversize holes in alignment with DUT-engaging holes in a nonconductive layer of the two layers that enable use of the first conductive layer as a guard layer held at a guard potential for electrical testing purposes in order to eliminate or at least significantly reduce the effects of stray impedances on test results. Additional conductive guard layers and nonconductive layers may be included. Conductive layers may take the form of conductive patterns etched into copper laminates on nonconductive layers composed of epoxy printed circuit board material.

14 Claims, 10 Drawing Sheets

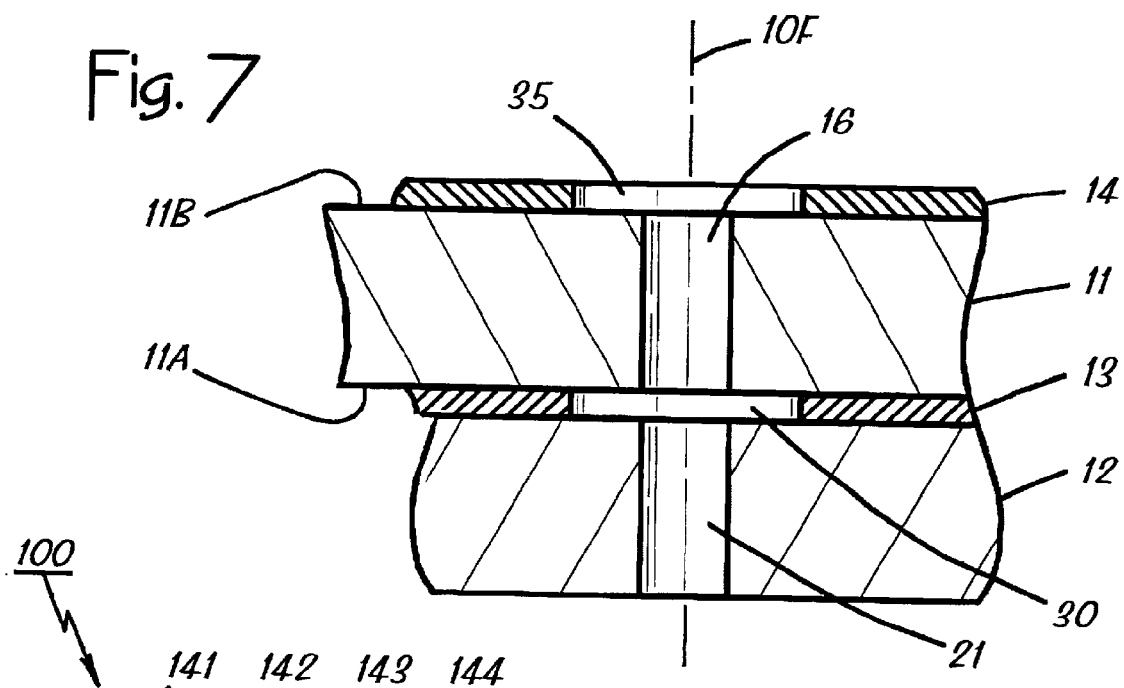
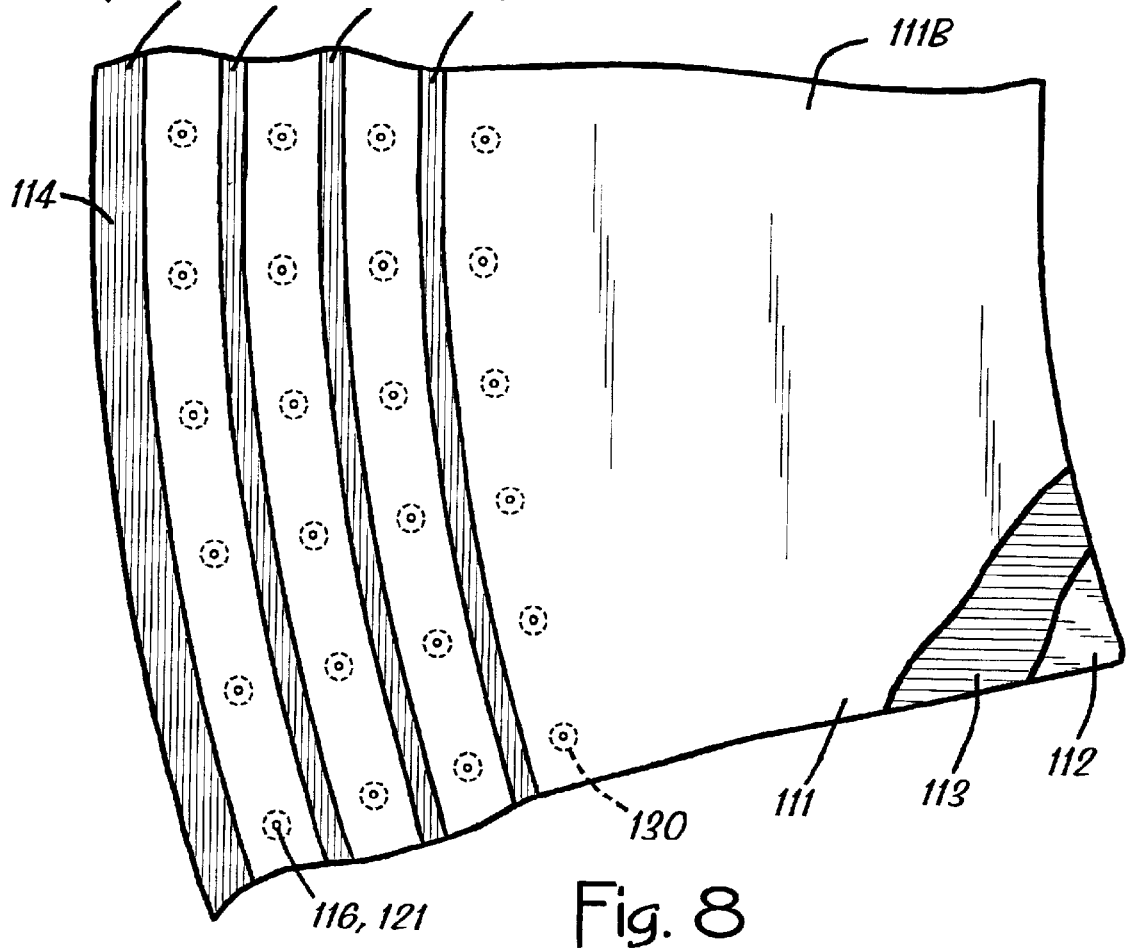

US 6,710,611 B2

TEST PLATE FOR CERAMIC SURFACE MOUNT DEVICES AND OTHER ELECTRONIC COMPONENTS

BACKGROUND OF THE INVENTION

1. Technical Field

This invention relates generally to the batch processing of miniature electronic circuit components, including passive, two-terminal, ceramic capacitors, resistors, inductors, and the like. More particularly, it concerns a test plate for holding such components or other type of device under test (DUT) as part of the batch processing for purposes of parametric testing.

2. Description of Related Art

The tiny size of electronic circuit components of interest herein complicates processing. Typically fabricated in parallelepiped shapes having dimensions as small as 0.020" by 0.010" by 0.010," more or less, these difficult-to-handle components require appropriate equipment and precision handling techniques. What is sometimes referred to as a "carrier plate" holds many hundreds of the components upright in spaced-apart positions as the ends of each component are coated with a conductive material to produce electrical terminals. After adding terminals, a "test plate" holds the large batch of components for movement past a contactor assembly of a testing system for parametric testing purposes and eventual sorting. Thoughtful design of each of these components promotes efficient processing. Reference may be made to U.S. Pat. Nos. 6,204,464; 6,294,747; 6,194,679; 6,069,480; 4,395,184; and 4,669,416 for examples of some prior art component handling systems and testing techniques.

The test plate is of particular interest. Mechanically, the test plate must hold the DUTs securely enough as they move past the contactor assembly so that they are presented to the contactor assembly in a repeatable, mechanically stable position. Electrically, the test plate must not degrade test results. But the mechanical and electrical functions are conflicting. Various forms of grease, grime, dirt, dust and other electrically conductive material on the test plate and/or on the DUTs provide unwanted conductive paths (i.e., stray impedances) to the DUT terminals. The stray impedances can render test results inaccurate. Thus, manufacturers engaged in batch processing of miniature electronic circuit components seek improvement in test plate design in that respect and so a need exists for a better test plate.

SUMMARY OF THE INVENTION

This invention addresses the concerns outlined above by providing a multilayer test plate. It may be used in testing any of various passive components, including capacitors, resistors, multilayer inductors, inductor beads, varistors, thermistors, fuses, sensors, actuators, and the like. The multilayer test plate has at least two layers, one conductive and one nonconductive. The nonconductive layer holds the DUTs while the conductive layer functions as a guard layer that enables the measurement system to eliminate, or at least significantly reduce the effects of stray impedances. The test plate can be configured as a direct replacement for existing test plates, and one embodiment even includes an additional guard layer that includes a pattern of rings (guard tracks) between rings of DUT-engaging holes in the two nonconductive layers.

To paraphrase some of the more precise language appearing in the claims, the invention provides a test plate in the form of a DUT-holding plate having a rotational axis and at least two layers centered on the rotational axis. A nonconductive layer of the two layers is composed of an electrically nonconductive material (e.g., epoxy printed circuit board material) that defines a plurality of DUT-engaging holes. A conductive layer of the two layers is composed of an electrically conductive material (e.g., copper) that defines a plurality of oversized holes such that each of the oversized holes is in alignment with a respective one of the DUT-engaging holes. The oversized holes have a size larger than the DUT-engaging holes in order to avoid having the conductive layer contact a DUT held by the test plate. That arrangement enables use of the conductive layer as a guard layer held at a guard potential for electrical testing purposes. It can be held at a desired guard potential and thereby eliminate, or at least significantly reduce, the effect of stray impedances on test results.

One embodiment of the invention includes a second conductive layer on an opposite side of the nonconductive layer. The second conductive layer can be used as a second guard layer held at a second guard potential that is the same or different from the guard potential at which the first conductive layer is held. The second conductive layer may include oversized holes and/or one or more radially spaced-apart conductive rings (i.e., guard tracks) disposed intermediate radially spaced-apart rings of DUT-engaging holes in the nonconductive layers. In addition, the invention can be readily fabricated by etching conductive patterns on double-sided, copper-clad, printed circuit board material to result in the first nonconductive layer being sandwiched in between the two conductive layers. Additional conductive and nonconductive layers can be added thereafter.

Thus, the invention provides a multilayer test plate that improves upon and better balances its mechanical and electrical functions. It includes at least two layers, at least one of which is a conductive guard layer. It may include one or more additional guard layers and/or nonconductive layers. It can be fabricated using printed circuit board techniques, and it can be configured as a direct replacement for existing test plates. The following illustrative drawings and detailed description make the foregoing and other objects, features, and advantages of the invention more apparent.

BRIEF DESCRIPTION OF THE DRAWINGS

FIG. 7 is an enlarged cross sectional view of a portion of the multilayer test plate as viewed in a vertical plane bisecting one of the DUT-receiving holes;

FIG. 8 is an enlarged top plan view of a portion of a second embodiment of the invention, having a second conductive layer with four, circular guard tracks intermediate radially spaced apart rings of DUT-receiving holes;

DESCRIPTION OF THE PREFERRED EMBODIMENTS

FIGS. 1–7 of the drawings show various aspects of a multilayer test plate 10 constructed according to the invention. Generally, a test plate constructed according to the invention includes at least two layers such that at least one layer is conductive and at least one layer is nonconductive. That way, the conductive layer can be used as a guard layer held at a desired guard potential for testing purposes. A test plate constructed according to the invention may have more than two layers and more than one conductive guard layer. The illustrate test plate 10 includes four layers of which two are conductive and two are nonconductive.

Figure 1:
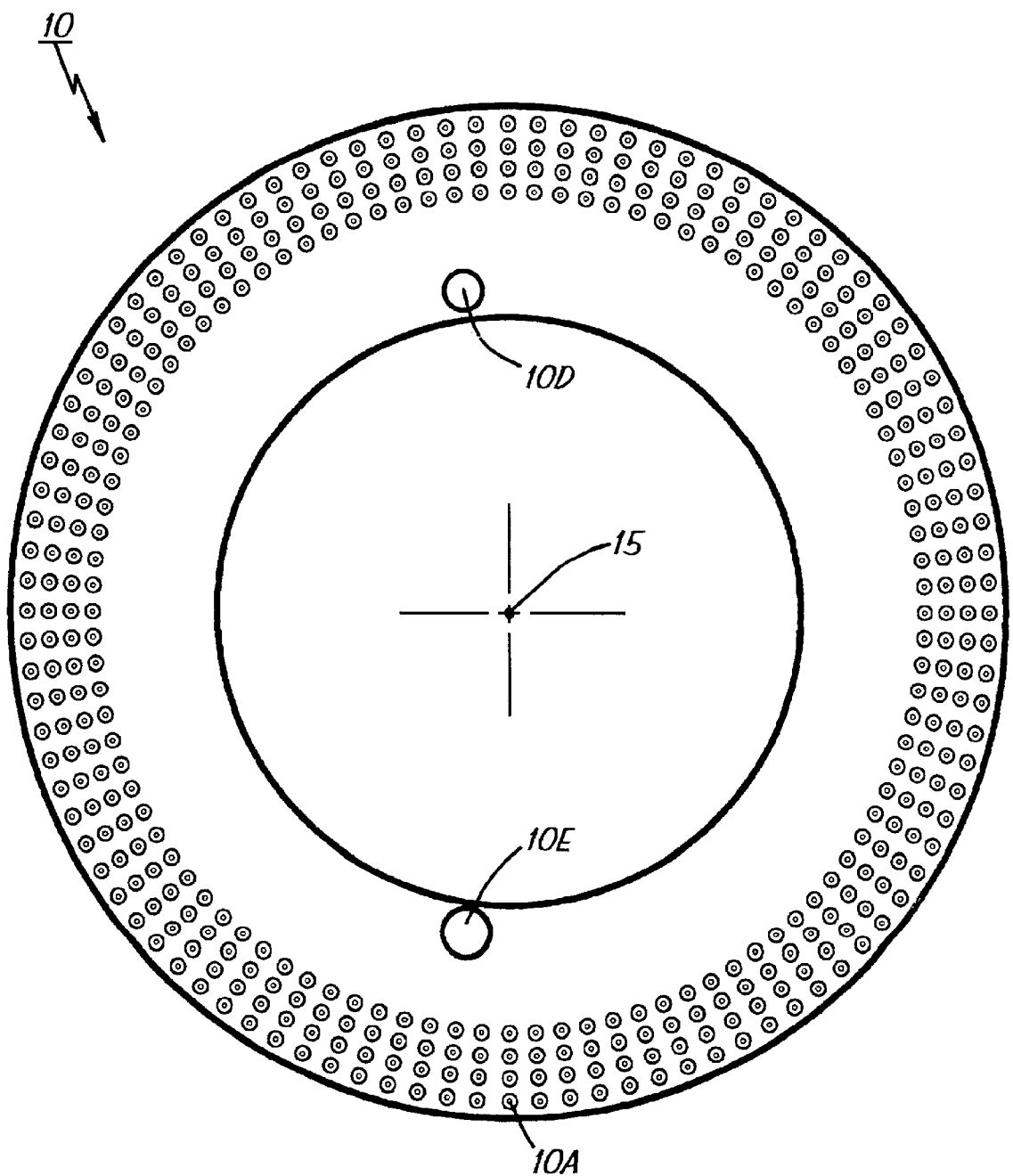
FIG. 1 of the drawings is a top plan view of a multilayer test plate constructed according to the invention.

The layers of the test plate 10 combine to define an array of DUT-receiving holes 10A, just one such DUT-receiving hole 10A being identified in FIG. 1 for illustrative convenience. The illustrated test plate 10 includes four hundred, circularly shaped, DUT-receiving holes 10A arranged in four radially spaced apart, concentric rings of one hundred, circumferentially spaced apart holes each. Of course, the number, shape, and pattern of the holes can vary without departing from the inventive concepts disclosed.

Figure 9:
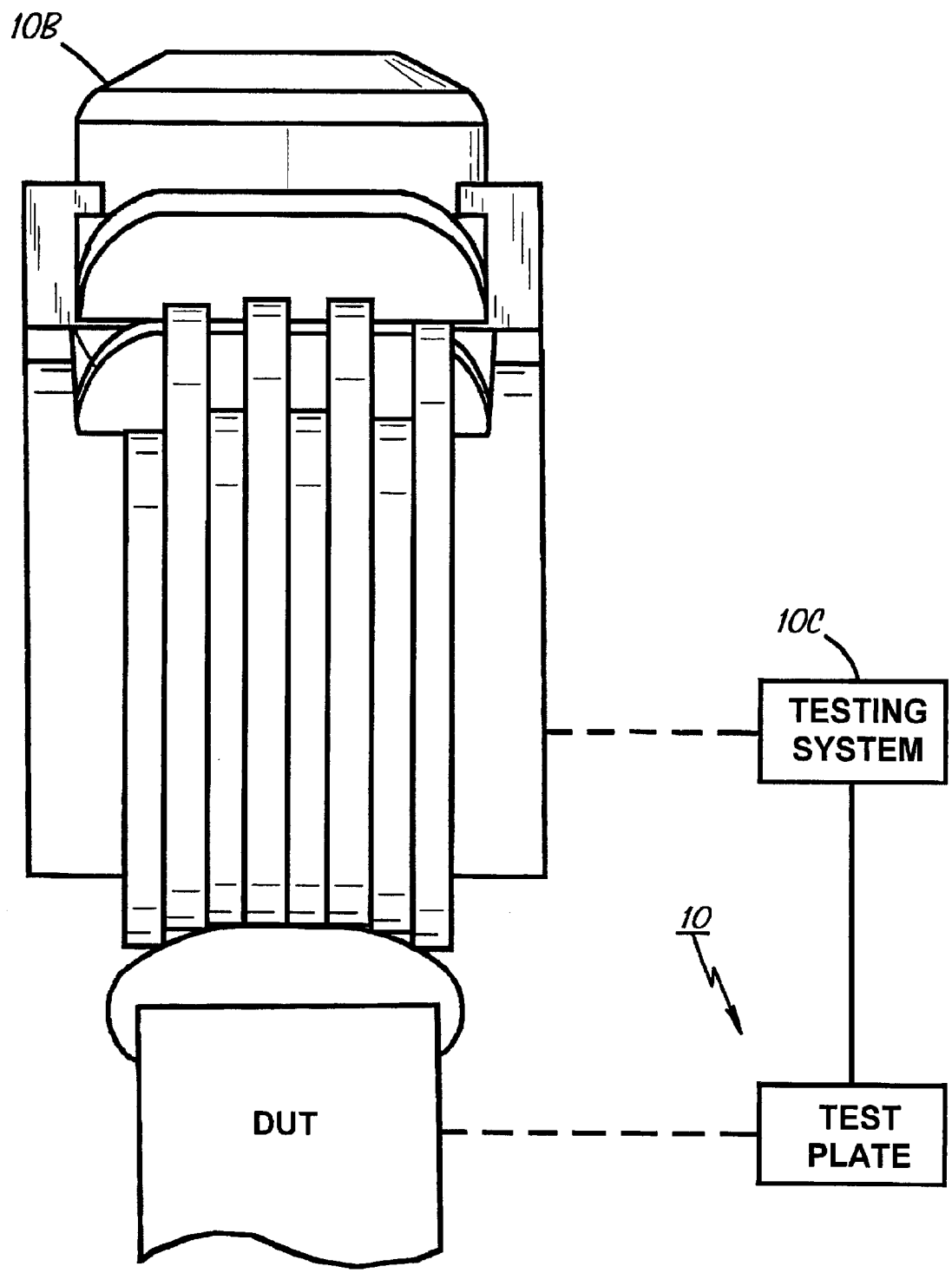
FIG. 9 is a diagrammatic representation of the multilayer test plate in its usual environment, holding a DUT for movement past a contactor assembly of a component testing system.

With a batch of DUTs in the DUT-receiving holes 10A, the test plate 10 serves the function of holding the batch of DUTs for movement past a contactor assembly 10B on a component testing system 10C depicted diagrammatically in FIG. 9. The component testing system 10C typically includes alignment pins (not shown) that seat in a pair of alignment holes 10D and 10E extending through the test plate 10 (FIG. 1) in order to help align the test plate 10 with supporting structure on the component testing system. Related details are described in the U.S. Pat. Nos. 6,204,464; 6,294,747; 6,194,679; 6,069,480; 4,395,184; and 4,669,416 mentioned previously. In addition, U.S. patent application Ser. No. 10/097,464 provides details of the contactor assembly 10B and its operation in the testing system 10C, and that patent application is incorporated herein by reference for the details provided.

Generally, the illustrated multilayer test plate 10 includes four layers in the form of first and second nonconductive layers 11 and 12, and first and second conductive layers 13 and 14. Those four layers are disposed symmetrically about a rotational axis 15 of the test plate 10 that is identified in FIGS. 1–6. The four layers 11–14 of the test plate 10 combine to function both mechanically and electrically. They physically hold a DUT for movement past a contactor assembly while reducing the effects of stray impedances that might otherwise degrade test results.

Introducing the nomenclature used in this description and in the claims, the first nonconductive layer 11 is said to include opposite first and second sides 11A and 11B that extend parallel to each other and perpendicular to the rotational axis 15. The first side 11A of the first nonconductive layer 11 is identified in FIGS. 2 and 7. It faces the first conductive layer 13 as illustrated in FIG. 7. The second side 11B of the first nonconductive layer 11 is identified in FIGS. 2, 3, and 7. It faces the second conductive layer 14 as illustrated in FIG. 7.

The four layers 11–14 are bonded together or otherwise suitably attached to form the test plate 10. The resulting structure can be described as having the first nonconductive layer 11 sandwiched in between the first and second conductive layers 13 and 14, the first conductive layer 13 sandwiched in between the first and second non conductive layers 11 and 12, and the combination of the first nonconductive layer 11 and the first conductive layer 13 sandwiched in between the second nonconductive layer 12 and the second conductive layer 14.

Figure 2:
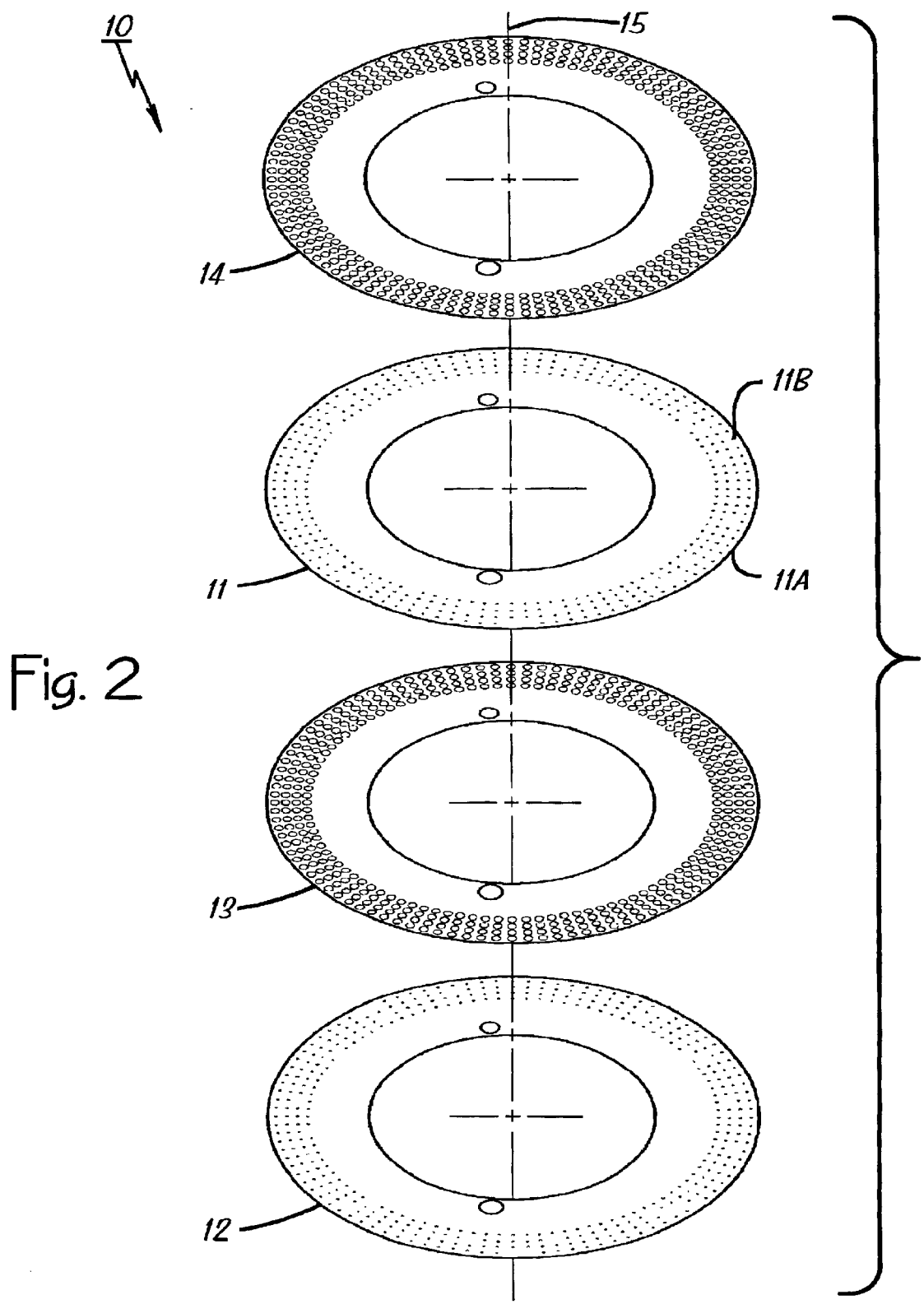
FIG. 2 is a reduced-in-size exploded view of the multilayer test plate showing the first and second nonconductive layers and the first and second conductive layers.
Figure 3:
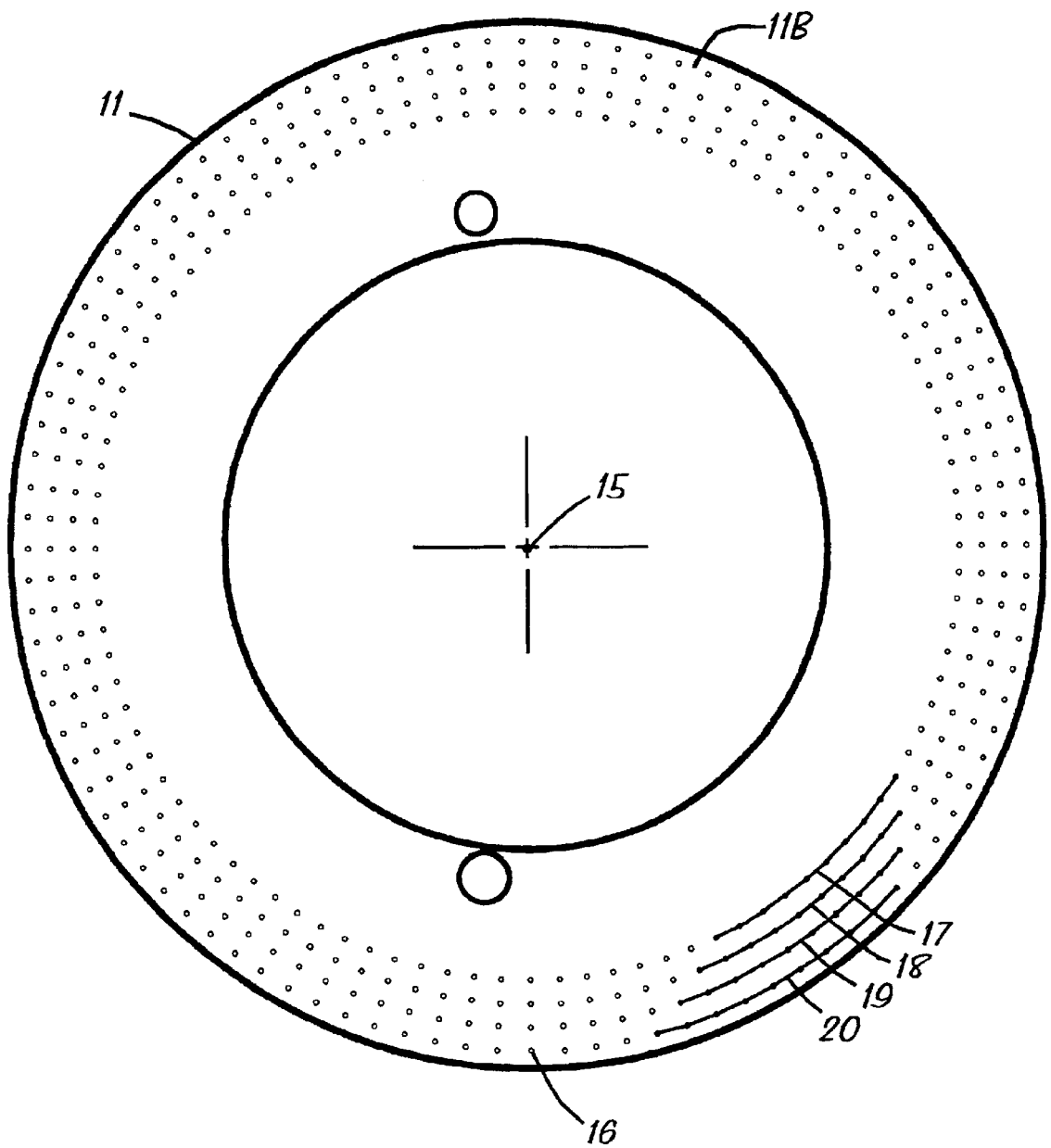
FIG. 3 is a top plan view of just the first nonconductive layer of the test plate.

Now consider the details of each of the illustrated layers 11–14 beginning with the first nonconductive layer 11 shown in FIGS. 2, 3, and 7. It is a circularly shaped, measuring about 0.130 millimeters (mm) thick (between first and second sides 11A and 11B) and about 300 mm in diameter (perpendicular to the rotational axis 15). It is composed of an electrically nonconductive material (e.g., the G10 epoxy material of a piece of double-sided, copper-clad printed circuit board material), and it defines a first plurality of DUT-engaging holes 16, just one individual DUT-engaging hole 16 being identified in FIG. 3 for illustrative convenience. There are four hundred such DUT-engaging holes 16 defined by the first nonconductive layer 11, enough to hold four hundred DUTs.

The DUT-engaging holes 16 are DUT-engaging in the sense that they hold DUTs with a close fit for movement past a contactor assembly (e.g., the contactor assembly 10B in FIG. 9) for testing purposes. They are arranged in a pattern of four rings 17, 18, 19, and 20 (FIG. 3), each ring consisting of one hundred holes spaced apart center-to-center at 3.6-degree intervals. Illustratively, the centers of ten of the DUT-engaging holes 16 in each of the four rings 17–20 are connected by lines in FIG. 3 in order to thereby identify the pattern of rings. The connecting lines are for illustration purposes and do not represent part of the design. The four rings 17–20 so illustrated are centered on the rotational axis 15 and spaced apart radially, having respective radii measuring about 120 mm, 126 mm, 133 mm, and 130 mm.

The illustrated DUT-engaging holes 16 are circular with diameters of about 1.0 mm. They are sized and shaped to present a close fit for the DUTs that are to be held by the test plate 10 so that the DUT-engaging holes 16 engage and hold the DUTs. Thus, the size and shape of the DUT-engaging holes 16 may vary significantly from what is described and illustrated herein according to the DUTs to be held. The pattern in which the DUT-engaging holes 16 are arranged may vary too. Moreover, the other sizes, shapes, and particular materials described in this specification may also vary without departing from the in the broader inventive concepts disclosed, namely, a multilayer test plate having at least two layers enabling use of use of one conductive layer as a guard layer for testing purposes.

With further regard to hole size, it depends on a number of things. If it is a round hole, the diameter of the hole must be slightly larger than the diagonal (from corner to corner) of the DUT. Generally, a DUT will be encouraged, perhaps by a combination of vibration and gravity, to fall into the hole so that the two terminated ends of the DUT are protruding slightly from the upper and lower surface of the test plate. If the hole is square, the dimensions of the hole must be slightly larger than the cross sectional dimensions of the DUT. Square holes are sometimes effectively used to capture DUTs that have a square cross section. Rectangular holes must have a diagonal that is slightly larger than the diagonal of the DUT. Rectangular holes are sometimes effectively used in a situation where the DUT length and width are close to the same dimension.

Figure 4:
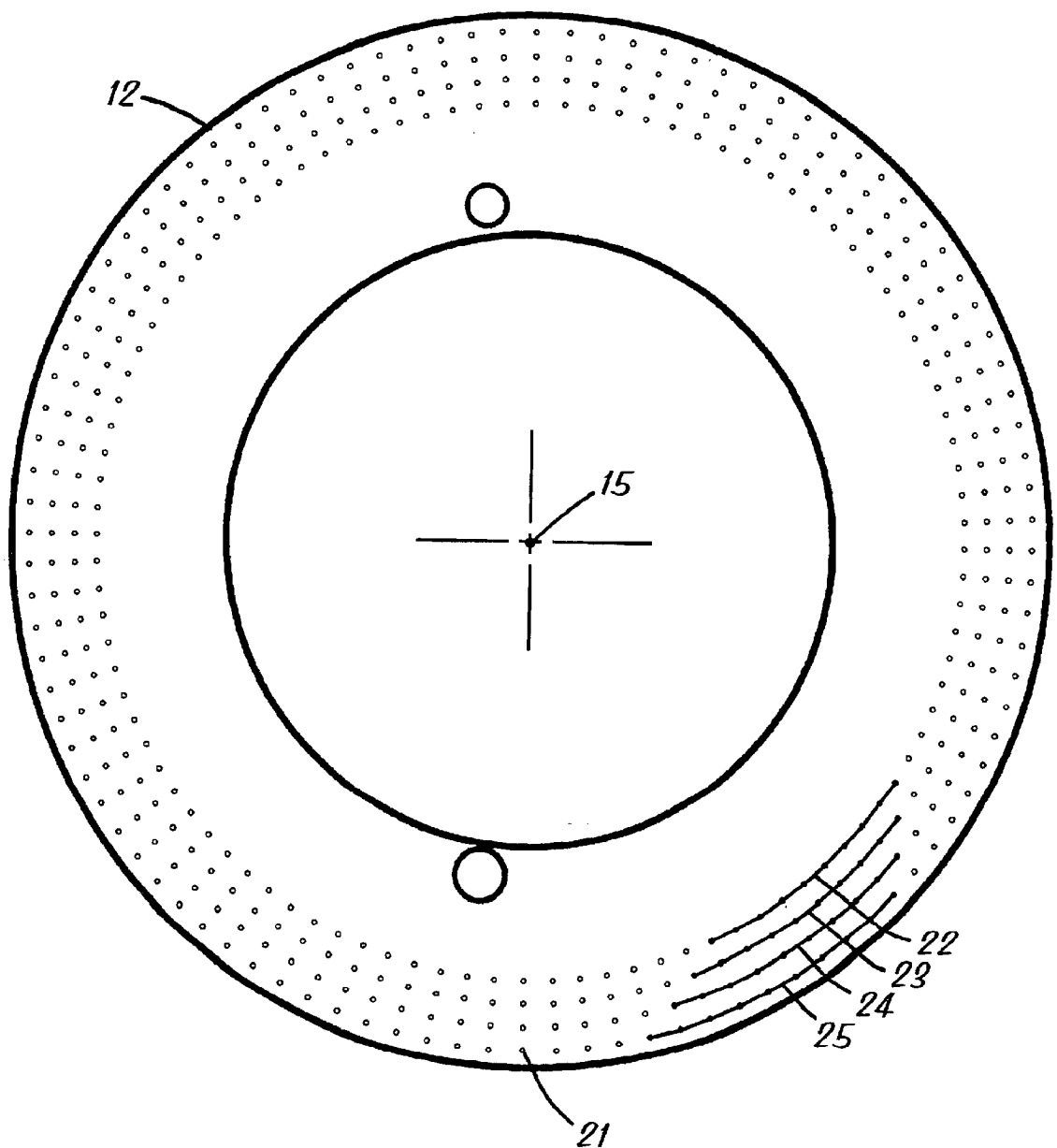
FIG. 4 is a top plan view similar to FIG. 3 of just the second nonconductive layer of the test plate.

The second nonconductive layer 12 shown in FIGS. 2, 4, and 7 is similar to the first nonconductive layer 11. It is a circularly shaped, also measuring about 0.018 mm thick and about 300 millimeters in diameter. Of course, those dimensions apply to the illustrated test plate 10. The thickness of any other test plate constructed according to the invention and the individual layers of the test plate are set according to the length of the chips to be tested. The thickness of the test plate should be slightly less than the length of the chip so that the two terminated ends extend out of the DUT-receiving holes. Similar to the nonconductive layer 11, the nonconductive layer 12 is composed of an electrically nonconductive material (e.g., bare G10 epoxy printed circuit board material) and it defines a second plurality of DUT-engaging holes 21, just one individual DUT-engaging hole 21 being identified in FIG. 4 for illustrative convenience. There are four hundred such DUT-engaging holes 21 defined by the second nonconductive layer 12, and each one is aligned with a respective one of the DUT-engaging holes 16 in the first nonconductive layer 11. In other words, each one of the second plurality of DUT-engaging holes 21 is centered on an axis common to it and a respective one of the DUT-engaging holes 16 as indicated by an axis 10F in FIG. 7.

Similar to the DUT-engaging holes 16, the DUT-engaging holes 21 are arranged in a pattern of four rings 22, 23, 24, and 25 (FIG. 4), each ring consisting of one hundred DUT-engaging holes 21 spaced apart center-to-center at 3.6-degree intervals. As with FIG. 3, the centers of ten of the DUT-engaging holes 21 in each of the four rings 22–25 are connected by lines in FIG. 4 in order to thereby identify the pattern of rings. The four rings 22–25 are centered on the rotational axis 15 and spaced apart radially, having respective radii measuring about 120 mm, 126 mm, 133 mm, and 130 mm.

Similar to the DUT-engaging holes 16, the illustrated DUT-engaging holes 21 are circular with diameters of about 1.0 mm. They are sized and shaped to present a close fit for the DUTs to be held by the test plate 10 so that the DUT-engaging holes 21 engage and hold the DUTs. Thus, the DUT is held by both the DUT-engaging hole 16 and the DUT-engaging hole 21 at spaced apart locations along its length to result in greater stability of the DUT as it is moved past the contactor assembly 10B in FIG. 9 mentioned previously. As explained above for the first nonconductive layer 11, the size and shape of the DUT-engaging holes 21 in the second nonconductive layer 12 may vary significantly from what is described and illustrated herein according to the DUTs to be held.

Figure 5:
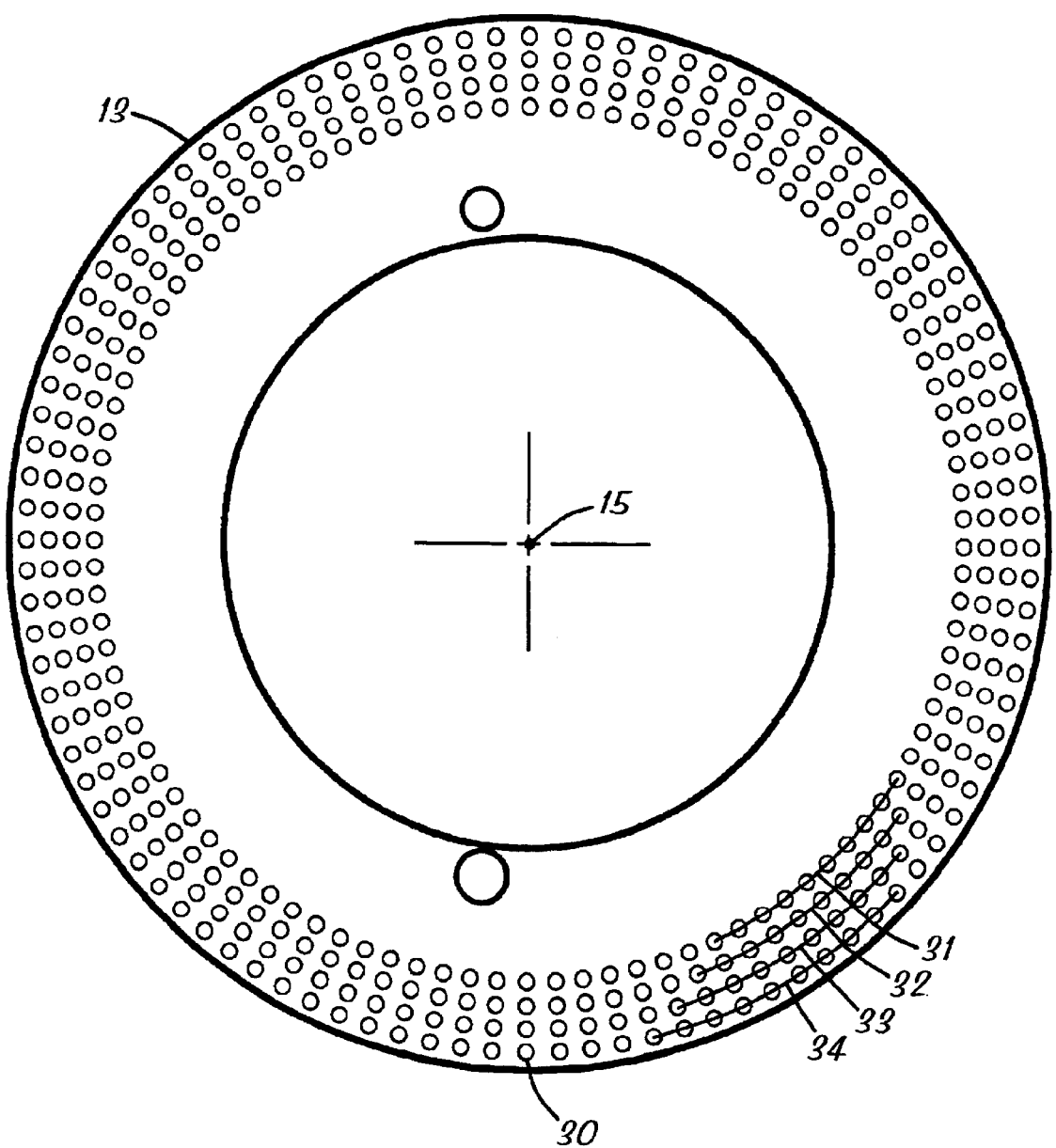
FIG. 5 is a top plan view of just the first conductive layer of the test plate.

Turning now to the first conductive layer 13 shown in FIGS. 2, 5, and 7, it is similar in shape to the first and second nonconductive layers 11 and 12. It is circularly shaped and about 300 mm in diameter. Unlike the first and second nonconductive layers 11 and 12, however, the first conductive layer is composed of an electrically conductive material and it defines a first plurality of oversized holes 30, just one individual oversized hole 30 being identified in FIG. 5 for illustrative convenience. The first conductive layer may, for example, take the form of a 0.018 mm thick copper laminate on the first side 11A of the first nonconductive layer 11. In that case, the second nonconductive layer 12 (e.g., bare G10 epoxy printed circuit board material) is affixed to the first conductive layer 13 by bonding or other suitable means after the laminate on the first conductive layer 13 is etched into the desired pattern of oversized holes 30.

There are four hundred such oversized holes 30 defined by the first conductive layer 13, and each one is aligned with a respective one of the first plurality of DUT-engaging holes 16 in the first nonconductive layer 11 and a respective one of the second plurality of DUT-engaging holes 21 in the second nonconductive layer 12. Each one of the first plurality of oversized holes 30 is centered on an axis common to it and the respective ones of the DUT-engaging holes 16 and 21 as indicated by the axis 10F in FIG. 7. The oversized holes 30 are oversized in the sense that they are larger than the DUT-engaging holes 16 and 21 so that the first conductive layer 13 does not contact a DUT held in the DUT-engaging holes 16 and 21. With DUT-engaging holes 16 and 21 of diameters 1.0 mm, for example, each of the first plurality of oversized holes 30 has a diameter measuring about 3.0 mm.

In a general sense, the oversized holes of a test plate constructed according to the invention should be large enough so that the voltages applied for insulation resistance test (e.g., 1000 volts in some cases) will not arc from the test contact or DUT terminal to the guard layer. This concern is more critical when the guard layer is on the outside of the test plate (e.g., the conductive layer 14) as compared to being embedded within the inner layers (e.g., the conductive layer 13). On the other hand, the oversized holes should not be any larger than necessary in order for the guard layer to provide the maximum guarding effect possible. Based upon the foregoing and subsequent descriptions herein, one of ordinary skill in the art can readily implement a test plate with guard layers having suitably oversized holes.

The extra size of the oversized holes 30 results in the first conductive layer 13 circumscribing a DUT held in the DUT-engaging holes 16 and 21 without contacting the DUT. The first conductive layer 13 extends fully around the DUT without contacting the DUT as a first guard layer that can be held at ground potential or other desired guard potential in a known way during component testing. An operational amplifier may couple the guard potential of a measuring bridge to the first guard layer, for example, using vias fabricated in the test plate 10 for that purpose. So connected, the first guard layer serves the important function of helping to reduce the effect of stray impedances on test results, stray impedances referring to the various impedance paths that may otherwise be coupled electrically to DUTs held by the test plate 10 with undesired effects on test results.

Similar to the DUT-engaging holes 16 and 21, the oversized holes 30 are arranged in a pattern of four rings 31, 32, 33, and 34 (FIG. 5), each ring consisting of one hundred oversized holes 30 spaced apart center-to-center at 3.6-degree intervals. As with FIGS. 3 and 4, the centers of ten of the oversized holes 30 in each of the four rings 31–34 are connected by lines in FIG. 5 in order to thereby identify the pattern of rings. The connecting lines are not part of the design. The four rings 31–34 so identified are centered on the rotational axis 15 and spaced apart radially, having respective radii measuring about 120 mm, 126 mm, 133 mm, and 130 mm.

Figure 6:
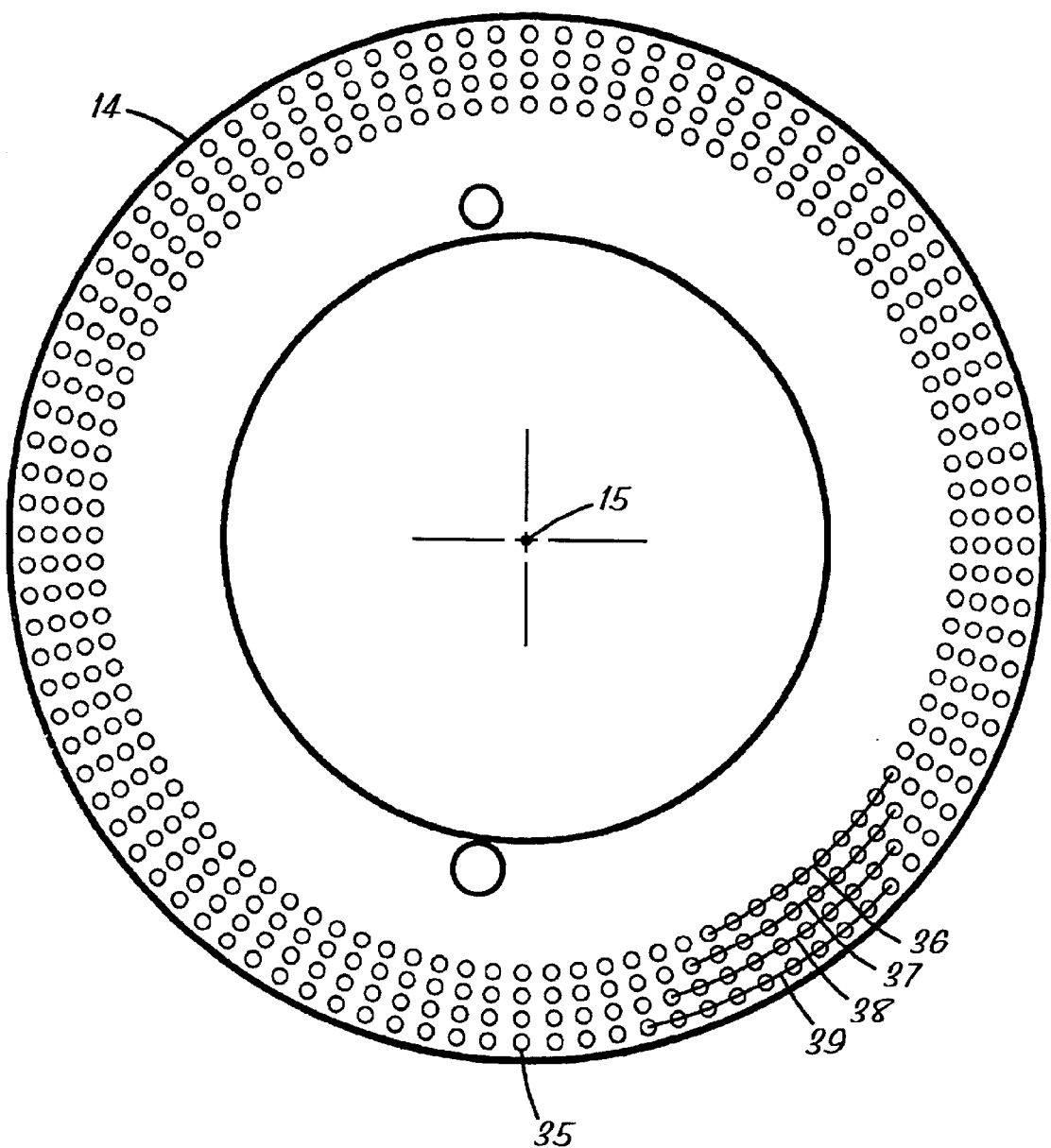
FIG. 6 is a top plan view similar to FIG. 5 of just the second conductive layer of the test plate.

The second conductive layer 14 shown in FIGS. 2, 6, and 7 is similar in many respects to the first conductive layer 13. It is circularly shaped, about 300 mm in diameter, composed of an electrically conductive material (e.g., a 0.018 mm thick copper laminate on the second side 11B of the first nonconductive layer 11), and it defines a second plurality of oversized holes 35, just one individual oversized hole 35 being identified in FIG. 6 for illustrative convenience.

There are four hundred such oversized holes 35 also. Each one is aligned with a respective one of the first plurality of DUT-engaging holes 16 in the first nonconductive layer 11, a respective one of the second plurality of DUT-engaging holes 21 in the second nonconductive layer 12, and a respective one of the first plurality of oversized holes 30 in the first conductive layer 13. Each one of the second plurality of oversized holes 35 is centered on an axis common to it, the respective ones of the DUT-engaging holes 16 and 21, and the respective one of the first plurality of oversized holes 30, as indicated by the axis 10F in FIG. 7. The extra size of the oversized holes 35 results in the second conductive layer 14 circumscribing a DUT held in the DUT-engaging holes 16 and 21 without contacting the DUT.

Thus, the second conductive layer 14 circumscribes the DUT held in the DUT-engaging holes 16 and 21 as a second guard layer that can be held at a common or different guard potential than the first conductive layer 13 during component testing. The second guard layer can be coupled to the first guard layer, for example, with vias fabricated in the test plate 10 or by means of a conductive lining in one or both of the alignment holes 10D and 10E (not shown). As with the first guard layer, the second guard layer serves the function of helping to reduce the effect of stray impedances on test results.

The oversized holes 35 defined by the second conductive layer 14 are also arranged in a pattern of four rings 36, 37, 38, and 39 (FIG. 6), each ring consisting of one hundred oversize holes 35 spaced apart center-to-center at 3.6-degree intervals. As with FIGS. 3, 4 and 5, the centers of ten of the oversized holes 35 in each of the four rings 36–39 are connected by lines in FIG. 6 in order to thereby identify the pattern of rings. The four rings 36–39 so identified are also centered on the rotational axis 15 and spaced apart radially, having respective radii measuring about 120 mm, 126 mm, 133 mm, and 130 mm.

FIG. 8 shows a second embodiment of the invention in the form of a multilayer test plate 100. The test plate 100 is similar in many respects to the test plate 10 and so only differences are described in further detail. For convenience, reference numerals designating parts of the test plate 100 are increased by one hundred over the reference numerals designating corresponding or related parts of the test plate 10.

The multilayer test plate 100 includes first and second nonconductive layers 111 and 112 (e.g., G10 epoxy printed circuit board substrates). The first and second nonconductive layers 111 and 112 define DUT-engaging holes 116 and 121 that are arranged in rings similar to the rings of DUT-engaging holes 16 and 21 described above for the test plate 10. Only one pair of holes 116 and 121 is identified in FIG. 8 for illustrative convenience. The test plate 100 also includes first and second conductive layers 113 and 114 in the form of electrically conductive patterns formed by etching them into copper laminates on opposite sides of the first nonconductive layer 111 during the fabrication process. The first conductive layer 113 defines oversized holes 130, only one of which is identified in FIG. 8, and that configures the first conductive layer 113 for use as a first guard layer. The second conductive layer 114 does not define oversize holes, but includes four conductive rings or guard tracks 141, 142, 143, and 144 instead. The guard tracks 141–144 extend circumferentially as illustrated to establish a guard potential for DUTs held in the DUT-engaging holes 116 and 121. Any of various other patterns may be employed according to the guard attributes desired.

Figure 10:
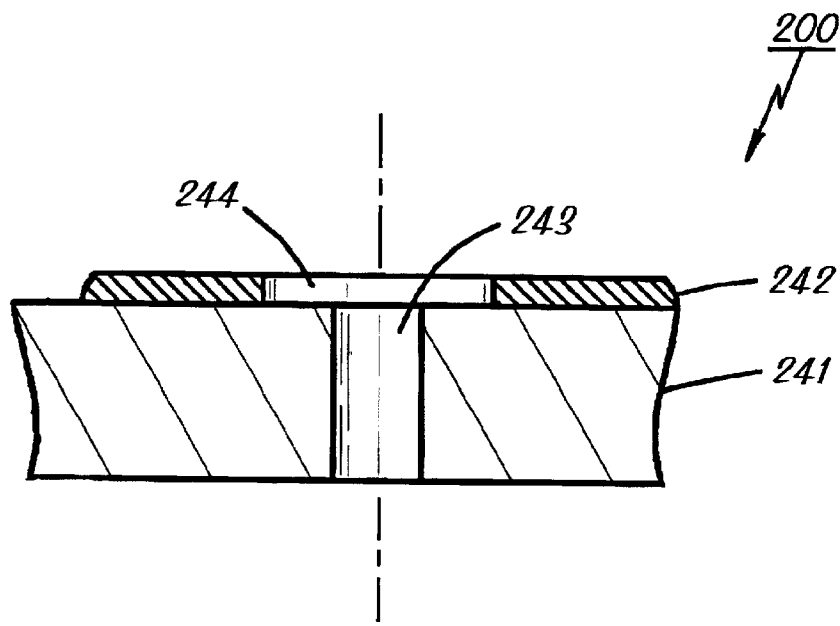
FIG. 10 is an enlarged cross sectional view of a portion of a third embodiment of the invention, having just two layers.

FIG. 10 shows a portion of a third embodiment of the invention in the form of a multilayer test plate 200. The test plate 200 is similar in many respects to the test plate 10 (see FIG. 7) and so only differences are described in further detail. The major difference is that the test plate 100 includes only one nonconductive layer 241 and one conductive layer 242. The nonconductive layer 241 defines DUT-engaging holes 243 and the conductive layer defines oversized holes 244 that are aligned with the DUT-engaging holes 243 so that the conductive layer 242 can function as a guard layer.

Figure 11:
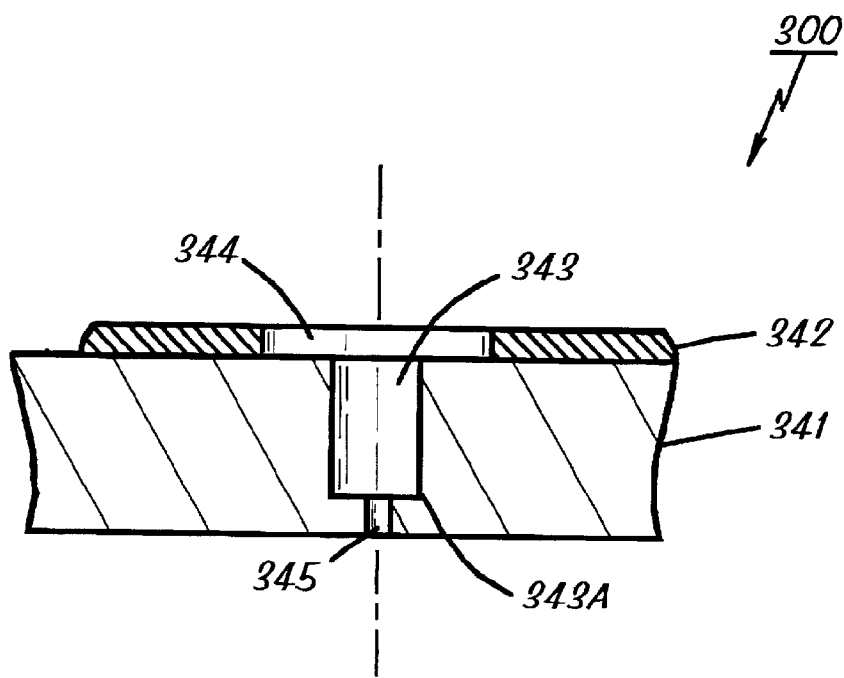
FIG. 11 is an enlarged cross sectional view of a portion of a fourth embodiment of the invention similar to the third embodiment in FIG. 10 except that it has a blind hole with an air inlet hole instead of a through hole.

FIG. 11 shows a portion of a fourth embodiment of the invention in the form of a multilayer test plate 300. The test plate 300 is similar in many respects to the test plate 200 and so only differences are described in further detail. Similar to the test plate 200, the test plate 300 includes only one nonconductive layer 341 and one conductive layer 342 that define DUT-engaging holes 343 and oversized holes 344, only one of each being illustrated and identified. The major difference is that the DUT-engaging holes 343 are blind holes instead of being through holes like the DUT-engaging holes 243. They are blind holes in the sense that they narrow sufficiently in cross section so that a DUT cannot pass fully through the hole. The illustrated DUT-engaging hole 343 narrows abruptly at a region identified in FIG. 11 by reference numeral 343A. Preferably, an inlet hole 345 is provided in fluid communication with the DUT-engaging hole 343 so that pressurized air can be forced through the inlet hole 345 to the DUT-engaging holes 343 for purposes of dislodging a DUT held within the DUT-engaging hole 343 (i.e., blow the DUT out of the hole).

Figure 12:
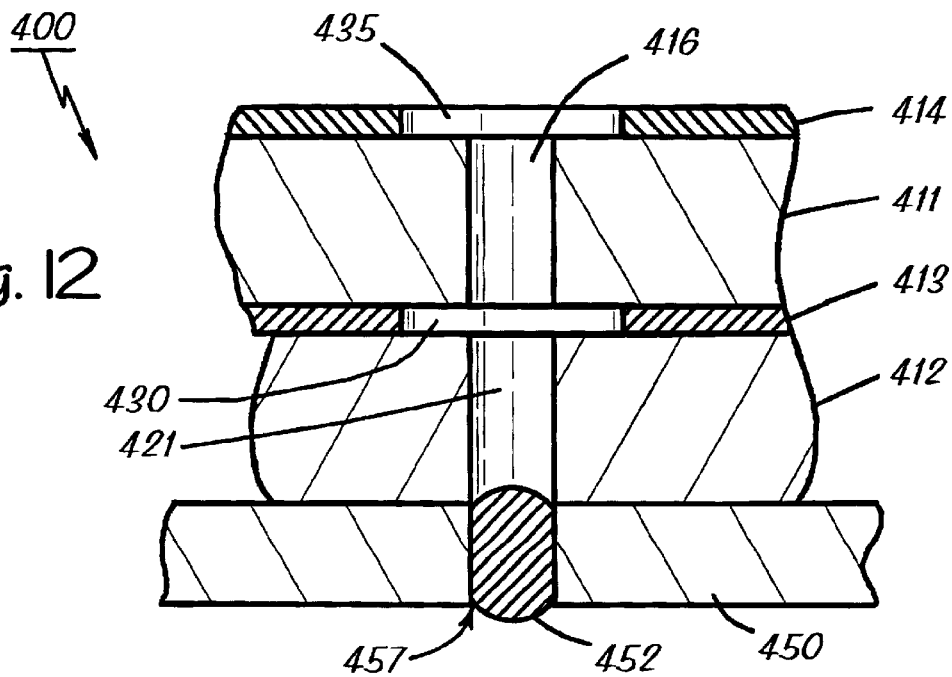
FIG. 12 is an enlarged cross sectional view similar to FIG. 7 of a portion of a fifth embodiment of the invention having a companion nonconductive layer that includes a contact.

FIG. 12 shows a portion of a fifth embodiment of the invention in the form of a test plate 400. The test plate 400 is similar in many respects to the test plate 10 (see FIG. 7) and so only differences are described in further detail. For convenience, reference numerals designating parts of the test plate 400 are increased by four hundred over the reference numerals designating corresponding or associated parts of the test plate 10.

Similar to the test plate 10, the test plate 400 includes first and second nonconductive layers 411 and 412 that define DUT-engaging holes 416 and 421, and it includes conductive layers 413 and 414 that define oversize holes 430 and 435. The test plate 400 also includes an additional, separate, companion nonconductive layer 450 upon which the second nonconductive layer 412 (the lower nonconductive layer) rests when in use testing DUTs. An electrically conductive contact 452 is provided within a hole 457 in the companion nonconductive layer 412 for contacting a terminal on the lower end of a DUT held within the DUT-engaging holes 421 and 416. That way, the test system can make contact with the terminal on the lower end of the DUT without requiring that the terminal on the lower end of the DUT slide across a contact. The contact 452 is an intermediate contact, and this companion-layer technique can be used with any test plate constructed according to the invention with through holes.

Figure 13:
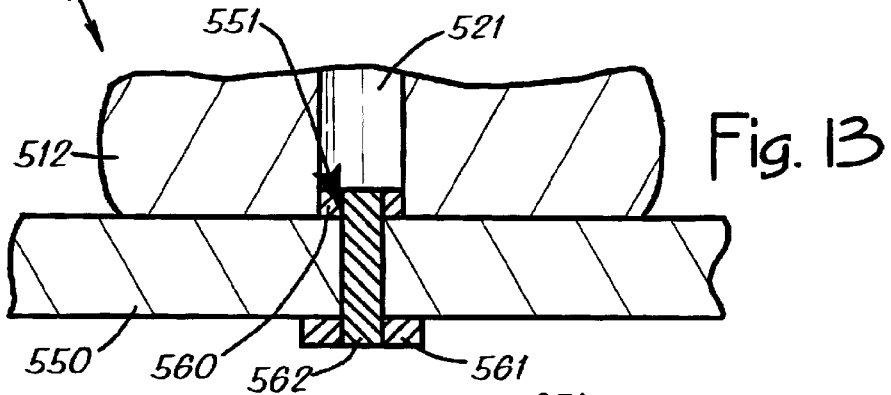
FIG. 13 is an enlarged cross sectional view similar to FIG. 12 of a portion of a sixth embodiment of the invention having a companion nonconductive layer with a contact formed by top and bottom etched patterns connected by a via.

FIG. 13 shows a portion of a sixth embodiment of the invention in the form of a test plate 500. The test plate 500 is similar in many respects to the test plate 400 and so only differences are described in further detail. For convenience, reference numerals designating parts of the test plate 500 are increased by one hundred over the reference numerals designating corresponding or associated parts of the test plate 400.

Similar to the test plate 400, the test plate 500 includes a nonconductive layer 512 that defines a DUT-engaging hole 521. It also includes a companion layer 550 having an electrically conductive contact extending through a hole 551 in the companion nonconductive layer 550. The major differences is that the contact is formed by joining an upper conductive pad 560 (a portion of an upper etched pattern on an upper surface of the nonconductive layer 560) to a lower conductive pad 561 (a portion of a lower etched pattern) with a via 562 using known printed circuit board techniques.

Figure 14:
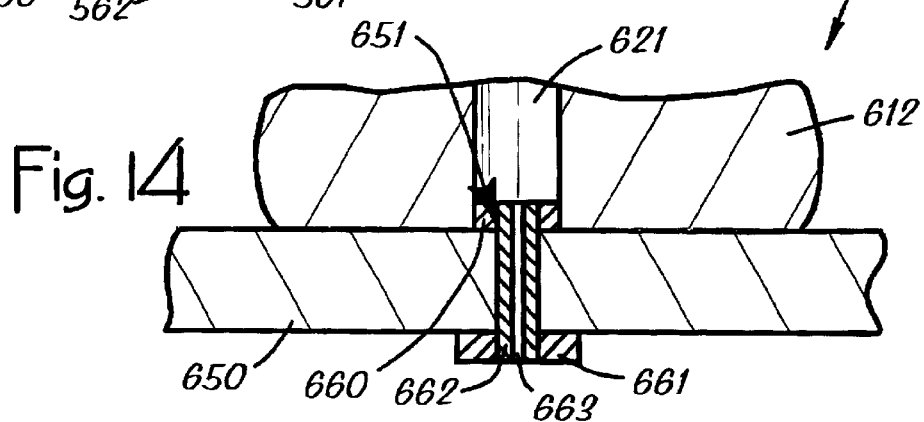
FIG. 14 is an enlarged cross sectional view similar to FIG. 13 of a portion of a seventh embodiment of the invention having a companion nonconductive layer with small inlet holes through the contact that enable use of pressurized air for dislodging a DUT from the DUT-holding hole, only one such inlet hole being shown for illustrative convenience.

FIG. 14 shows a portion of a seventh embodiment of the invention in the form of a test plate 600. The test plate 600 is similar in many respects to the test plate 500 and so only differences are described in further detail. For convenience, reference numerals designating parts of the test plate 600 are increased by one hundred over the reference numerals designating corresponding or associated parts of the test plate 500.

Similar to the test plate 500, the test plate 600 includes a nonconductive layer 612 that defines a DUT-engaging hole 621. It also includes a companion layer 650 having an electrically conductive contact extending through a hole 651 in the companion nonconductive layer 650. The contact includes an upper conductive pad 660 and a lower conductive pad 661 that are connected with a via 662. The major differences is that the via defines an inlet hole 663 in fluid communication with the DUT-engaging hole 621 that can be used to couple a source of pressurized air or other case to the DUT-engaging hole 621 for purposes of disloding a DUT from the hole. Although only one inlet hole is illustrated for the test plate 600, it is within the scope of the invention to use several small inlet holes. Vias can be fabricated with diameters measuring only a few mils, and the use of several small inlet holes rather than one larger one can be advantageous because using several small inlet holes distributes the blow-off air more evenly in order to provide a more positive blow-off action.

Thus, the invention provides a test plate having at least two layers, a nonconductive layer and a conductive layer. The conductive layer can be held at a desired guard potential for testing purposes in order to eliminate or at least significantly reduce the effect of stray impedances. The test plate can be fabricated using known printed circuit board techniques and it can be configured as a direct replacement for existing test plates. It can have any shape, including circular, square, rectangular, polygonal. It can be any size desired. It can be configured with through holes or blind holes for chips having terminals on only one end. The holes can be any shape desired to hold and guard the particular DUTs to be tested, and it can be configured with a thickness suitable for a particular use. In other words, a test plate constructed according to the invention is a guarded test plate that can be used for testing any type of passive component. It has a minimum of two layers and no maximum. There is no restriction on shape, size, and thickness. There is no restriction on shape, size, quantity, or position of the DUT-receiving holes. Although exemplary embodiments have been shown and described, one of ordinary skill in the art may make many changes, modifications, and substitutions without necessarily departing from the spirit and scope of the invention.

What is claimed is:

1. A test plate, comprising:

a DUT-holding plate having a rotational axis and at least two layers centered on the rotational axis;

a first nonconductive layer of the plate that is composed of an electrically nonconductive material defining a first plurality of DUT-engaging holes in the first nonconductive layer; and a first conductive layer of the plate that is composed of an electrically conductive material defining a first plurality of oversized holes through the first conductive layer such that each of the first plurality of oversized holes is in alignment with a one of the first plurality of DUT-engaging holes;

the first plurality of oversized holes having a size larger than the first plurality of DUT-engaging holes in order to avoid having the first conductive layer contact a DUT, thereby to enable use of the first conductive layer as a guard layer for electrical testing purposes;

wherein the first plurality of DUT-engaging holes are not plated through holes providing an electrically conductive path through the nonconductive layer.

2. A test plate as recited in claim 1, wherein the first plurality of DUT-engaging holes are through holes extending through the first nonconductive layer.

3. A test plate, comprising:

a DUT-holding plate having a rotational axis and at least two layers centered on the rotational axis:

a first nonconductive layer of the plate that is composed of an electrically nonconductive material defining a first plurality of DUT-engaging holes in the first nonconductive layer; and a first conductive layer of the plate that is composed of an electrically conductive material defining a first plurality of oversized holes through the first conductive layer such that each of the first plurality of oversized holes is in alignment with a one of the first plurality of DUT-engaging holes;

the first plurality of oversized holes having a size larger than the first plurality of DUT-engaging holes in order to avoid having the first conductive layer contact a DUT, thereby to enable use of the first conductive layer as a guard layer for electrical testing purposes;

wherein the first plurality of DUT-engaging holes are blind holes in the first nonconductive layer.

4. A test plate, comprising:

a DUT-holding plate having a rotational axis and at least two layers centered on the rotational axis;

a first nonconductive layer of the plate that is composed of an electrically nonconductive material defining a first plurality of DUT-engaging holes in the first nonconductive layer; and a first conductive layer of the plate that is composed of an electrically conductive material defining a first plurality of oversized holes through the first conductive layer such that each of the first plurality of oversized holes is in alignment with a one of the first plurality of DUT-engaging holes;

the first plurality of oversized holes having a size larger than the first plurality of DUT-engaging holes in order to avoid having the first conductive layer contact a DUT, thereby to enable use of the first conductive layer as a guard layer for electrical testing purposes;

wherein the first plurality of DUT-engaging holes are blind holes in the first nonconductive layer; and wherein the first nonconductive layer defines at least one inlet hole in fluid communication with at least one of the blind holes in order to enable use of pressurized gas to dislodge DUTs from said one of the blind holes.

5. A test plate as recited in claim 1, wherein the first conductive layer is a conductive pattern on the first nonconductive layer.

6. A test plate as recited in claim 1, wherein:
the DUT-holding plate includes a second conductive layer such that the first nonconductive layer is disposed intermediate the first and second conductive layers; and
the second conductive layer is composed of an electrically conductive material defining a second plurality of oversized holes through the second conductive layer such that each of the second plurality of oversized holes is in alignment with a respective one of the first plurality of DUT-engaging holes.

7. A test plate as recited in claim 6, wherein the first and second conductive layers are conductive patterns on the first nonconductive layer.

8. A test plate as recited in claim 6, wherein the DUT-holding plate includes a second nonconductive layer that is composed of an electrically nonconductive material defining a second plurality of DUT-engaging holes through the second nonconductive layer such that each of the second plurality of DUT-engaging holes is in alignment with a respective one of the first plurality of DUT-engaging holes.

9. A test plate, comprising:
a DUT-holding plate having a rotational axis and at least two layers centered on the rotational axis;
a first nonconductive layer of the plate that is composed of an electrically nonconductive material defining a first plurality of DUT-engaging holes in the first nonconductive layer; and
a first conductive layer of the plate that is composed of an electrically conductive material defining a first plurality of oversized holes through the first conductive layer such that each of the first plurality of oversized holes is in alignment with a one of the first plurality of DUT-engaging holes;
the first plurality of oversized holes having a size larger than the first plurality of DUT-engaging holes in order to avoid having the first conductive layer contact a DUT, thereby to enable use of the first conductive layer as a guard layer for electrical testing purposes;
wherein the DUT-holding plate includes a second conductive layer such that the first nonconductive layer is disposed intermediate the first and second conductive layers;
wherein the second conductive layer is composed of an electrically conductive material defining a second plurality of oversized holes through the second conductive layer such that each of the second plurality of oversized holes is in alignment with a respective one of the first plurality of DUT-engaging holes;
wherein the first plurality of DUT-engaging holes in the first nonconductive layer includes a first pair of radially spaced apart rings of DUT-engaging holes centered on the rotational axis with first and second sizes of radii;

wherein the second plurality of DUT-engaging holes in the second nonconductive layer includes a second pair of radially spaced apart rings of DUT-engaging holes centered on the rotational axis with the first and second sizes of radii, and with the second pair of radially spaced apart rings of DUT-engaging holes aligned with the first pair of radially spaced apart rings of DUT-engaging holes; and wherein at least one of the first and second conductive layers includes a conductive guard track centered on the rotational axis with an intermediate size of radius that is intermediate the first and second sizes of radii.

10. A test plate as recited in claim 1, further comprising a companion nonconductive layer having at least one contact arranged to extend into a DUT-engaging hole on the test plate for purposes of contacting a terminal on a DUT in the DUT-engaging hole.

11. A test plate, comprising:
a DUT-holding plate having a rotational axis and at least three layers centered on the rotational axis;
a first nonconductive layer of the plate that is composed of an electrically nonconductive material defining a first plurality of DUT-engaging holes through the first nonconductive layer;
a second nonconductive layer of the plate that is composed of an electrically nonconductive material defining a second plurality of DUT-engaging holes through the second nonconductive layer such that each of the second plurality of DUT-engaging holes is in alignment with a respective one of the first plurality of DUT-engaging holes; and
a first conductive layer of the plate that is composed of an electrically conductive material disposed intermediate the first and second layers, the electrically conductive material defining a first plurality of oversized holes through the first conductive layer such that each of the first plurality of oversized holes is in alignment with respective ones of the first and second pluralities of DUT-engaging holes;
the first plurality of oversized holes having a size larger than the first and second pluralities of DUT-engaging holes in order to avoid having the first conductive layer contact a DUT and thereby to enable use of the first conductive layer as a guard for electrical testing purposes;
wherein the first plurality of DUT-engaging holes are not plated through holes providing an electrically conductive path through the nonconductive layer.

12. A test plate as recited in claim 11, wherein the plate includes a second conductive layer such that the first nonconductive layer of the plate is disposed intermediate the first and second conductive layers.

13. A test plate, comprising:
a DUT-holding plate having a rotational axis and at least three layers centered on the rotational axis;
a first nonconductive layer of the plate that is composed of an electrically nonconductive material defining a first plurality of DUT-engaging holes through the first nonconductive layer;
a second nonconductive layer of the plate that is composed of an electrically nonconductive material defining a second plurality of DUT-engaging holes through the second nonconductive layer such that each of the second plurality of DUT-engaging holes is in alignment with a respective one of the first plurality of DUT-engaging holes; and a first conductive layer of the plate that is composed of an electrically conductive material disposed intermediate the first and second layers, the electrically conductive material defining a first plurality of oversized holes through the first conductive layer such that each of the first plurality of oversized holes is in alignment with respective ones of the first and second pluralities of DUT-engaging holes;

the first plurality of oversized holes having a size larger than the first and second pluralities of DUT-engaging holes in order to avoid having the first conductive layer contact a DUT and thereby to enable use of the first conductive layer as a guard for electrical testing purposes;

wherein the plate includes a second conductive layer such that the first nonconductive layer of the plate is disposed intermediate the first and second conductive layers;

wherein the first plurality of DUT-engaging holes in the first nonconductive layer includes a first pair of radially spaced apart rings of DUT-engaging holes centered on the rotational axis with first and second sizes of radii;

wherein the second plurality of DUT-engaging holes in the second nonconductive layer includes a second pair of radially spaced apart rings of DUT-engaging holes centered on the rotational axis with the first and second sizes of radii, and with the second pair of radially spaced apart rings of DUT-engaging holes aligned with the first pair of radially spaced apart rings of DUT-engaging holes; and wherein at least one of the first and second conductive layers includes a conductive guard track centered on the rotational axis with an intermediate size of radius that is intermediate the first and second sizes of radii.

14. A test plate as recited in claim 12, wherein the first and second conductive layers are conductive patterns on the first nonconductive layer.

* * * * *